THERMOELECTRIC HEATING AND COOLING

Filed June 25, 1959 3 Sheets-Sheet 1

INVENTORS
EDSEL W. FRANTTI
ROBERT S. LACKEY
JACK D. MEESS
BY
ATTORNEY

INVENTORS
EDSEL W. FRANTTI
ROBERT S. LACKEY
JACK D. MEESS
BY William J. Foley
ATTORNEY

THERMOELECTRIC HEATING AND COOLING

Filed June 25, 1959 3 Sheets-Sheet 3

INVENTORS
EDSEL W. FRANTTI
ROBERT S. LACKEY
JACK D. MEESS
BY William J. Foley
ATTORNEY United States Patent Office — 2,959,925 — Patented Nov. 15, 1960

2,959,925

THERMOELECTRIC HEATING AND COOLING

Edsel W. Frantti, Robert S. Lackey, and Jack D. Meess, Pittsburgh, Pa., assignors to Westinghouse Electric Corporation, East Pittsburgh, Pa., a corporation of Pennsylvania Filed June 25, 1959, Ser. No. 822,962

9 Claims. (Cl. 62—3)

This invention is in the field of thermoelectric heating and cooling and deals with thermoelectric heat pump structures, particularly for a novel domestic appliance.

Thermoelectric heat pumps utilize a phenomenon known as the Peltier effect in the disposition or absorption of heat at a current carrying junction between two elements, or bodies, of dissimilar thermoelectric materials. As is true of most electrical equipment, there are optimum values of current and voltage to which a junction of given thermoelectric materials should be subjected in order to obtain from the heat pump system either the maximum heat pumping rate or the maximum coefficient of performance. The values of current and voltage vary, of course, with different thermoelectric materials, but, as a general rule, single junction heat pumps using presently known materials require unusually high currents at unusually low voltages.

Designers have, therefore, found it more practical to utilize an array of pairs of thermoelectric elements, or couples, electrically connected in series and thermally arranged in parallel. An array of a plurality of couples having a number of small area junctions has the same heat pumping ability as a single couple the junction area of which is equal to the combined areas of all of the smaller junctions. With series connection of multiple couples the electric current through the array is that which is required for an individual couple and the impressed voltage is the sum of the voltage requirements of all of the couples. The current is thus reduced to a more practical value and the voltage is raised, enabling smaller area electrical conductors to be employed throughout the heat pump and its power supply.

Needless to say, the fabrication and assembly of an array of, say, one hundred junctions is a difficult problem, which is compounded by such factors as the somewhat fragile nature of the semi-conductor type thermoelectric elements currently used and the necessity for making a large number of soldered electrical connections. Each soldered connection must be carefully made, so as to have low resistance in order to reduce Joule heating in the array. Prior arrays have been difficult and expensive to manufacture, so that the production of compact, practical appliances utilizing such arrays has not been economically feasible.

The present invention simplifies the construction and fabrication of multiple junction arrays and makes possible the construction of new and novel domestic appliances.

One serious problem in the construction of multiple junction thermoelectric arrays has to do with supporting the thermoelectric elements and maintaining the proper space relationships between the elements in the array. The elements themselves are subject to breakage and must therefore be supported firmly but gently in such a manner that they will not be damaged during normal usage. This is particularly important in thermoelectric applications for portable domestic appliances, which may receive considerable abuse during their lifetime.

Attempts have been made to support the thermoelectric elements in a lattice of insulating material but the lattice frequently interferes with or makes more difficult the problem of making the numerous soldered connections in the array.

In accordance with this invention, the thermoelectric elements of the heat pump are disposed between a heat absorbing structure and a heat dissipating structure and are positioned with respect to one or the other or both of these structures by means of spacer strips which project from the surface of one structure and are located between conducting members, or plates, which form the junctions between adjacent dissimilar thermoelectric elements. By means of this arrangement, it is possible to make the soldered connections between the thermoelectric elements and the conducting members prior to associating the elements with any additional supporting structure and, yet, assure support for and positioning of the elements when they are assembled to the heat absorbing and heat dissipating structures.

This positioning arrangement for the thermoelectric array is particularly suitable for use with cylindrical heat absorbing and heat dissipating structures which are concentrically arranged with a space therebetween for the thermoelectric array. Following the teachings of this invention, one of the cylinders is provided with a predetermined number of spacer rings on the surface thereof which faces the other cylinder. The thermoelectric couples are arranged in spaced rows or ladders which extend longitudinally along the cylinders and have their conducting members on one face of the array disposed between the cylinder spacer rings.

A further feature of the cylindrical heat pumping structure constructed in accordance with this invention is the use of a segmented outer cylinder which facilitates assembly of the heat pumping structure. It is contemplated that the array of thermoelectric couples be assembled to the inner cylinder and the segmented outer cylinder be thereafter assembled about the array and held in place by clamping means which apply substantially uniform compressive forces to the elements of the array to hold them against the inner cylinder and to insure good thermal transfer between the array and the cylinders.

This compact assembly is particularly useful in domestic appliance applications. The thermoelectric array is capable of pumping heat either from the inner cylinder to the outer cylinder or from the outer cylinder to the inner cylinder and the assembly can therefore be employed in either a heating appliance or a cooling appliance or a combined heating and cooling appliance, all of which utilize the inner cylinder as a container for the item or material that is to be cooled or heated. The outer cylinder forms a convenient location for heat transfer fins or the like for either absorbing heat from or dissipating heat to air surrounding the assembly.

One novel domestic appliance to which the principles of this invention are particularly applicable is an infant feeding bottle cooling and warming appliance, which will be described in detail hereinafter as a preferred embodiment of the invention. In this appliance, the cylindrical thermoelectric heat pump, or assembly, comprising the inner and outer cylinders and the thermoelectric array, is arranged as an upright top-opening container for receiving the bottle. The unitary nature of this assembly permits it to be removably supported by a base structure which contains the power supply for the thermoelectric array. This is particularly advantageous because it enables the bottle container to be separated and easily handled for cleaning and for filling and emptying the interior with a heat conducting fluid if such fluid is used. The unitary thermoelectric assembly may also be used in conjunction with a simplified base fixture for supplying electric current to the assembly directly from the electrical system of a vehicle, such as an automobile.

The cooling and warming appliance herein disclosed also embodies novel control features which render its operation automatic and increase the usefulness of the appliance. For example, in one embodiment of the invention, the base for the thermoelectric assembly includes a clock, or other timing means, for automatically reversing the direction of current flow to the thermoelectric array to convert it from cooling operation to heating operation at a preselected time and, under certain circumstances, to automatically return the array to cooling operation upon the lapse of a predetermined time interval. This appliance is thus capable of preserving the contents of an infant feeding bottle for an extended period of time by cooling, of elevating the contents to feeding temperature at a preselected feeding time, and is further capable of returning to cooling operation if the contents of the bottle are not consumed within a certain period of time thereafter.

Other features and advantages of the invention will be explained in the following detailed description of the invention wherein reference is made to the accompanying drawings, forming a part hereof, and wherein.

Figure 1:
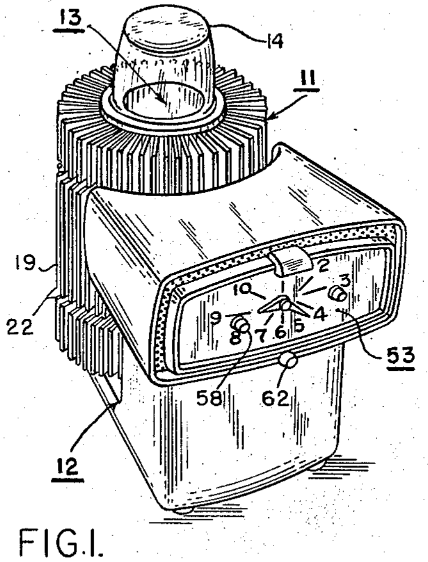
Fig. 1 is a perspective view of an infant feeding bottle cooler and warmer embodying the invention.

The bottle cooling and warming appliance illustrated in Fig. 1 has two principal components, namely a thermoelectric assembly, or heat pump 11, and a base 12 which serves as a support for the heat pump and houses electrical supply and control equipment for the pump. The heat pump 11 is, in reality, a top opening, upright container having a chamber 13 therein for receiving an infant feeding bottle or other items to be cooled or warmed. The opening to the chamber 13 is preferably closed by means of a heat insulating cap 14, which may be formed of plastic or other insulating material.

The heat pump 11 is constructed as a unitary assembly which is removable from the base 12 so as to permit it to be cleaned and to be filled with, or emptied of a heat transfer fluid, such as water, which may be employed to increase the flow of heat between the walls of chamber 13 and the item or items located therein. The construction of the heat pump is illustrated in detail in Figs. 2, 3 and 4 and comprises two concentrically arranged cylinders 16 and 17 formed of good heat conducting material, such as aluminum or copper. Disposed within the annular space between the two cylinders 16 and 17 is a thermoelectric array, indicated generally by the reference numeral 18. The array functions to transfer heat in either direction between cylinders 16 and 17 and, consequently, either cylinder may function as a heat absorbing structure while the other is functioning as a heat dissipating structure; the function of each structure depends upon the direction in which electric current is made to flow through the thermoelectric array 18. When the heat pump 11 is functioning to cool an infant's feeding bottle or the like heat is absorbed by the inner cylinder 16 and this heat is pumped to the outer cylinder 17, which dissipates the heat to air surrounding the heat pump. When heating an item the functions of the cylinders are reversed. The outer cylinder 17 is preferably provided with a plurality of vertically disposed fins 19, which add surface area to the cylinder 17 and increase its ability to dissipate heat and eliminates the necessity for forced circulation of air over the heat pump. As is readily understood, the fins 19 are preferably made of a good heat conducting material, such as aluminum or copper, and may be formed integrally with the outer cylinder 17 or fabricated separately and joined thereto by any suitable means, such as soldering or welding. The outer cylinder 17 is preferably segmented, i.e. split longitudinally, into cylindrical segments 20, preferably three in number, which are assembled onto the thermoelectric array 18 and held in place by circumferential clamping means, such as the contractable straps 21 disposed in notched out regions 22 of the fins 19 (see Fig. 3).

The thermoelectric array 18 is made up of a plurality of thermoelectric elements or bodies 23, alternate ones of which are formed of dissimilar thermoelectric materials, and a plurality of conducting plates or strips 24 and 25 which connect the ends of adjacent dissimilar elements 23 and form therewith a series electrical circuit through the array. The elements 23 are preferably of cylindrical shape with their axes arranged radially of the cylinders 16 and 17 and are also preferably arranged in circumferentially spaced rows extending longitudinally of the cylinders.

Figure 5:
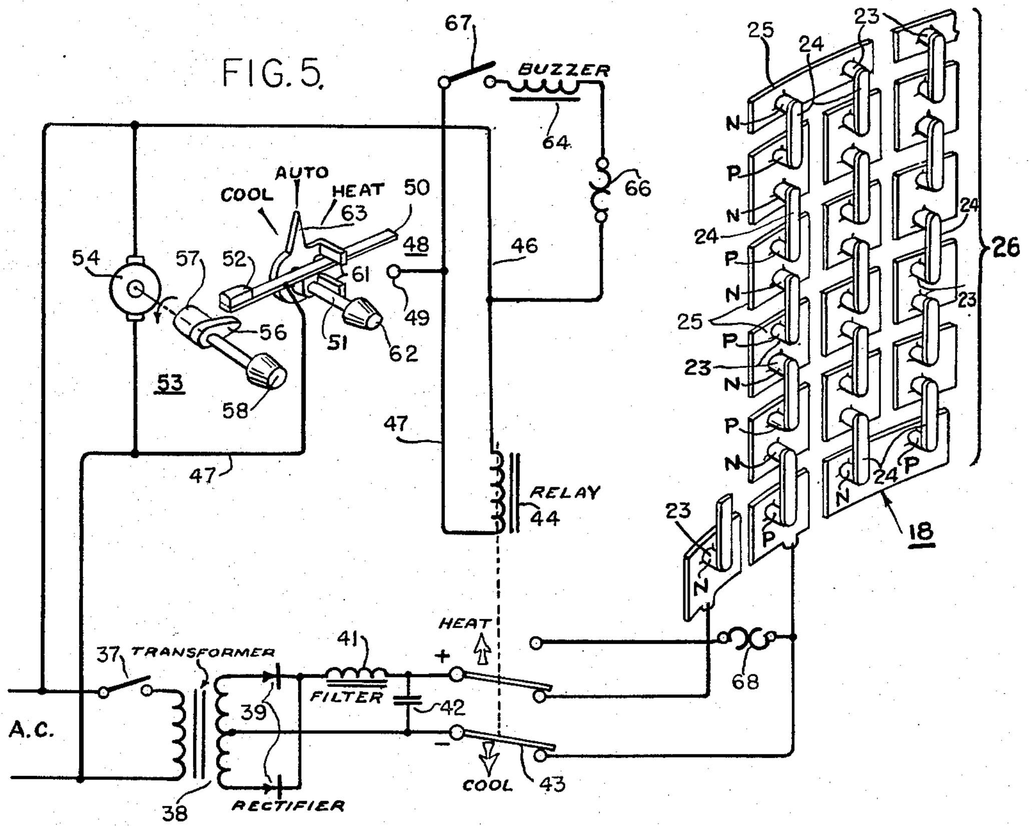
Fig. 5 is a schematic diagram of the electrical circuit for the bottle cooling and warming appliance of Fig. 1.

Conducting plates 24 connect the inner ends of adjacent dissimilar elements and are arranged in heat transfer relationship with the inner cylinder 16. Conducting plates 25 connect the outer ends of the thermoelectric elements and are arranged in heat transfer relationship with the outer cylinder 17. The conducting plates 24 and 25 are preferably soldered or welded to the ends of the thermoelectric elements 23 to reduce the electrical resistance of the connection and preferably connect vertically spaced elements to form ladder-like sub-assemblies 26, which extend longitudinally of the containers 16 and 17. As best shown in Fig. 5, the uppermost and lowermost of the outer conducting plates 25 connect the ends of the ladder-like sub-assemblies 26, so that all of the sub-assemblies are connected in series.

While this invention can be practiced with any suitable thermoelectric materials, bismuth telliuride, suitably doped to provide N and P type elements, is preferred over other presently known materials for this bottle cooler and warmer application. This material has the ceramic-like characteristic of being somewhat fragile and elements made therefrom are ilkely to break if subjected to extreme stress in either bending or tension. A single broken element in a thermoelectric array results in extreme loss of heat pumping ability of the array because of excessive heating at the break in the fractured element. For this reason, it is essential that all of the thermoelectric elements 23 in the array 18 be firmly, yet gently, supported so as to prevent their being damaged during normal use and cleaning of the heat pump 11.

Figure 2:
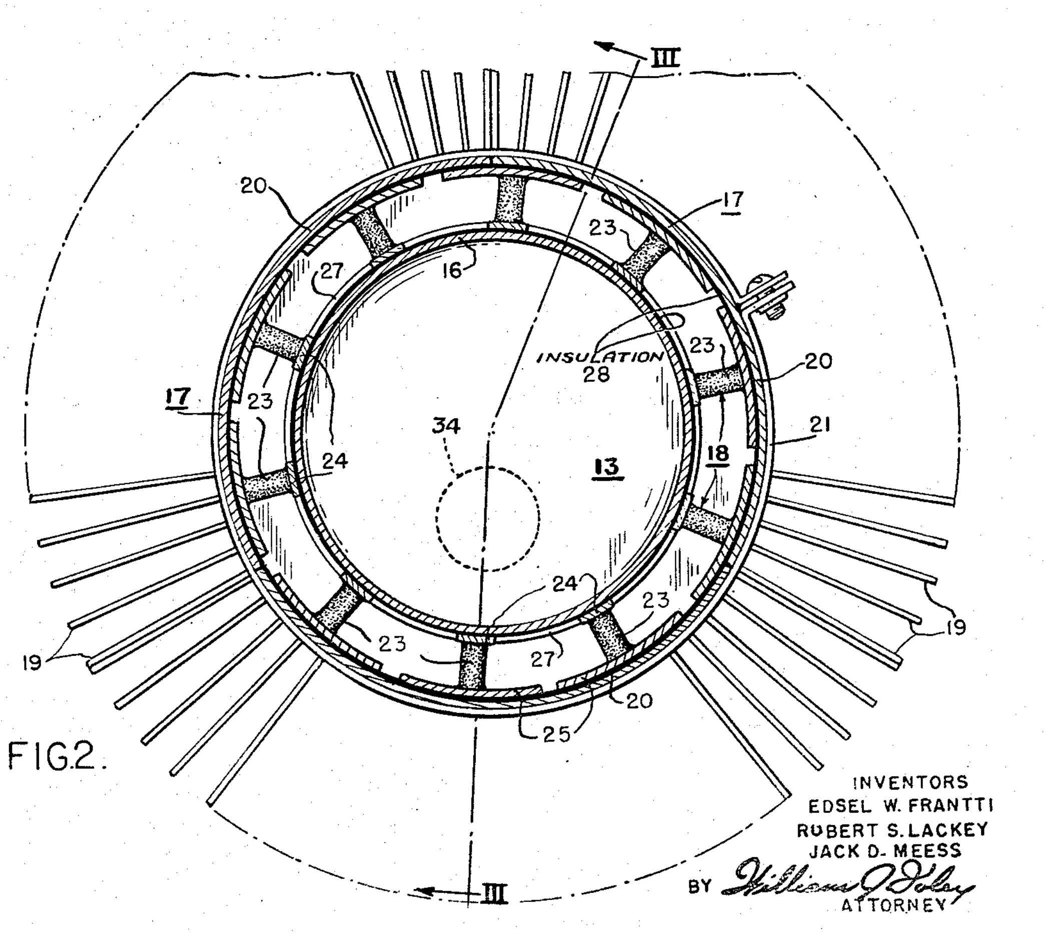
Fig. 2 is a fragmentary, horizontal sectional view through the thermoelectric heat pump of the appliance shown in Fig. 1.
Figure 3:
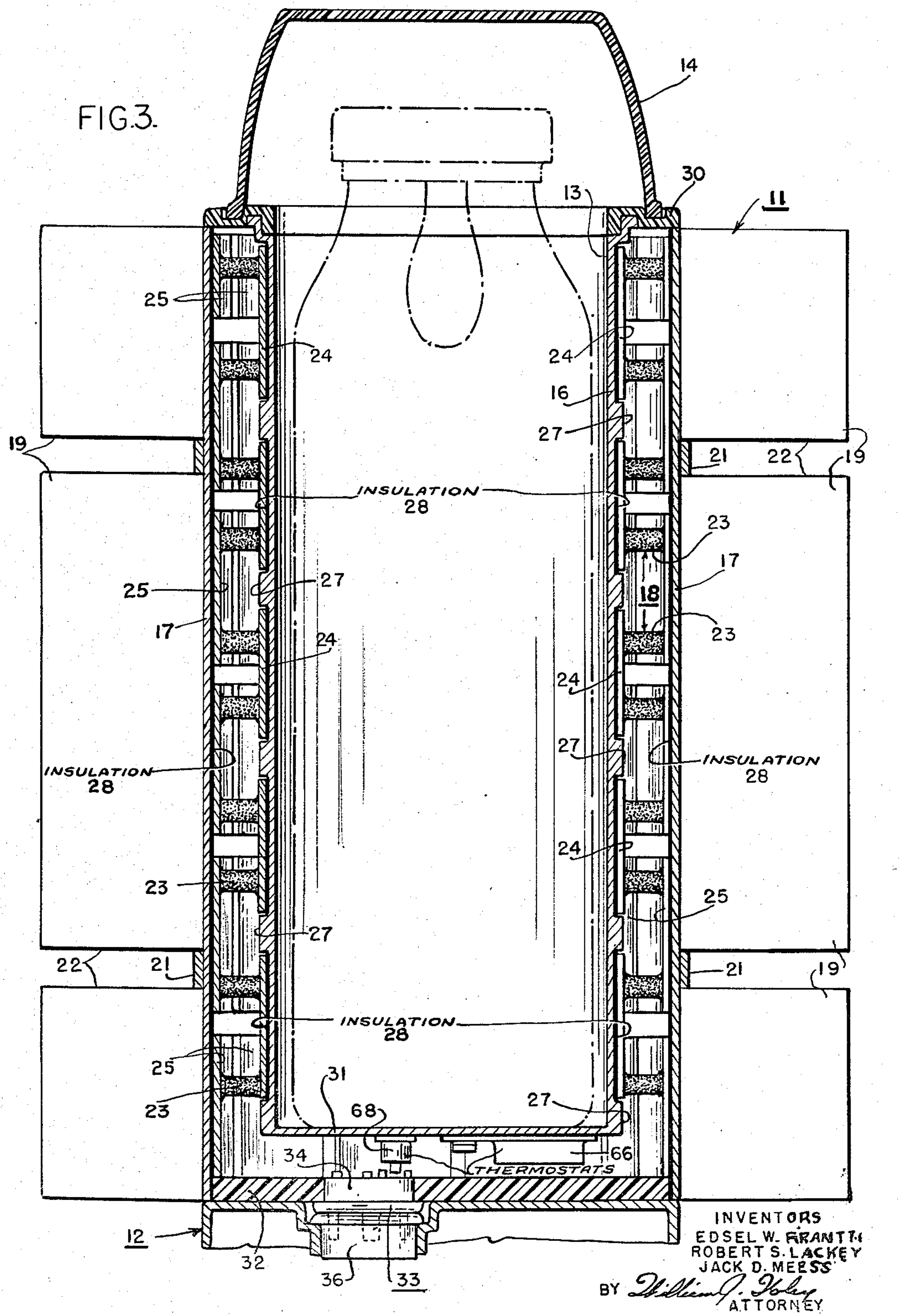
Fig. 3 is a vertical sectional view of the heat pump, taken as indicated by the line III—III in Fig. 2.

In accordance with this invention, the several elements 23 of the array 18 are positioned with respect to the heat absorbing and heat dissipating cylinders 16 and 17 by means of spacer strips 27 formed on the surface of one or the other of the cylinders 16 and 17. As shown in Figs. 2 and 3, these spacer strips 27 are preferably formed as ring-like projections on the outer surface of the inner cylinder 16 and extend into the space between adjacent edges of the inner conducting plates 24. The width of the strips 27 is preferably such as to permit them to be received loosely between adjoining conducting plates 24.

Although the spacer strips 27 are shown as being formed integrally with the inner cylinder 16, it should be apparent that they may, if desired, be formed separately and attached to the cylinder by any suitable means, such as by soldering. The conducting plates 24 are held tightly against the inner cylinder 16 so as to be in good heat transfer relationship therewith by means of the circumferential clamping straps 21, which apply inwardly directed forces through the segmented outer cylinder 17. This clamping action also assures that the outer cylinder 17 is in good thermal transfer relationship with the outer conducting plates 25. It is desirable that the conducting plates, 24 and 25, be somewhat flexible so that they can bend, or reshape, as the clamping straps 21 are tightened and assume the contour of the inner and outer cylinders 16 and 17. This improves thermal transfer between the conducting plates and the cylinders.

The conducting plates 24 and 25 must be electrically insulated from the inner and outer cylinders 16 and 17 in order to prevent the cylinders from shorting sections of the thermoelectric array. For this purpose, the outer surface of the inner cylinder 16 and the inner surface of the outer cylinder 17 are preferably coated with an electrically insulating enamel 28 or other insulating sheeting or coating which possesses fairly good thermal conduction properties.

The structure of the heat pump 11 is completed by inner and outer bottom walls 31 and 32, which close the lower ends of the inner and outer cylinders 16 and 17, respectively, and an annular closure 30 closing the space between the upper ends of the cylinders. The bottom wall 31 of the inner cylinder forms the bottom wall of chamber 13, in which items are cooled or heated, and is preferably formed of good heat conducting material, such as metal, to assist in the transfer of heat to or from such items and the inner cylinder. The outer bottom wall 32 may be formed of heat insulating material, such as plastic, to reduce heat leakage through the bottom wall of the heat pump. The space between the inner and outer cylinders 16 and 17 which is not occupied by the components of the thermoelectric array 18 is preferably filled with heat insulating material to reduce heat leakage through the cylinders in opposition to the heat pumped by the thermoelectric array. A powdered or granular insulating material, such as silica aerojel, is preferably used since it can be poured into the space between the inner and outer cylinders 16 and 17 prior to assembling closure ring 30. In the interest of simplification, this heat insulation is not illustrated in the drawings.

Figures 4, 7:
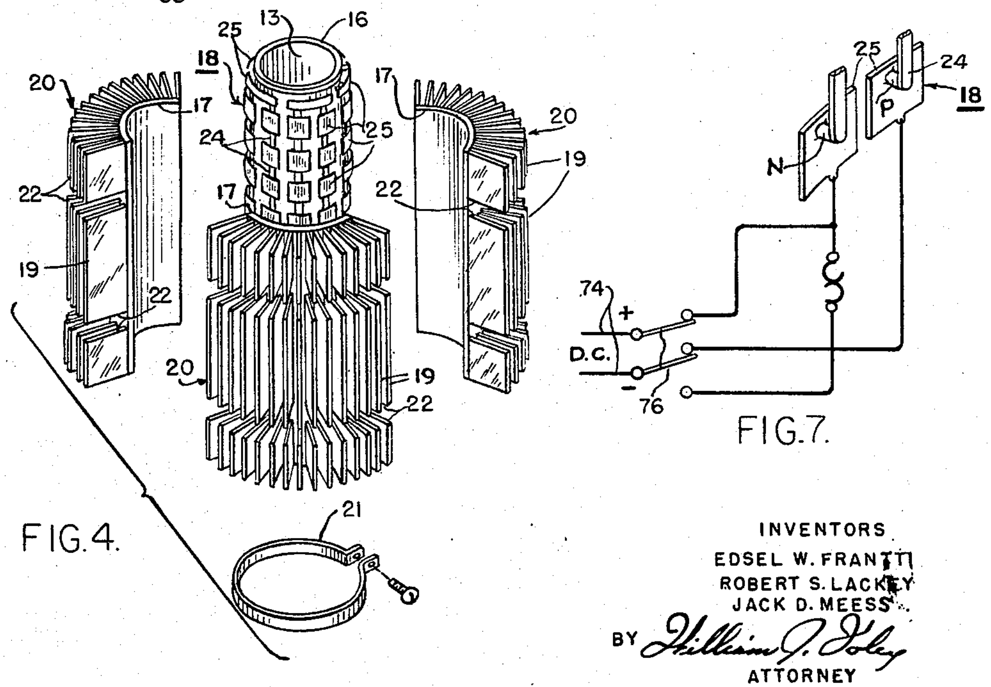
Fig. 4 is an exploded perspective view of the thermoelectric heat pump.
Fig. 7 is a schematic diagram of the electrical circuit for the appliance shown in Fig. 6.

The manner of assembling the heat pump 11 is best illustrated in Figs. 4 and 5. Conducting plates 24 and 25 are joined to alternate N and P type thermoelectric elements 23 to form a plurality of ladders 26, the ends of which are thereafter joined by other conducting plates into a series array. Inasmuch as the thermoelectric elements 23 are not at this stage surrounded by or imbedded in an insulating body or bodies, the soldered connections between these elements and the conducting plates 24 and 25 can be easily effected. If desired, jigs, or fixtures, may be employed to support the elements 23 during the soldering operation.

The series array 18 thus formed is bent into a cylindrical configuration about the inner cylinder 16 and is disposed on this cylinder with the inner conducting plates 24 disposed between the spacer strips 27 on the inner cylinder. The outer conducting plates 25, particularly the topmost and lowermost of these plates, are sufficiently flexible to permit the array to be formed about the inner cylinder 16.

The spacer strips 27 on cylinder 16 maintain the array 18 in position on this cylinder while the three segments 20 of the outer cylinder 17 are placed around the array 18 (see Fig. 4). The clamping strips 21 are thereafter installed and tightened to contract the assembly and force the outer cylinder 17 against the outer conducting plates 25 and the inner conducting plates 24 against the inner cylinder 16 to assure good heat transfer between the conducting plates and the heat absorbing and dissipating cylinders. The thermoelectric elements 23 and their conducting plates 24 and 25 are firmly and uniformly held in compression between the cylinders 16 and 17 as a result of the use of the circular clamping straps 21. Moreover, disarrangement and resultant breakage of the elements 23 during use is unlikely because their position is positively maintained by the positioning strips, or rings, 27 on the inner cylinder.

From the foregoing it should be apparent that the simplified construction of the heat pump 11, resulting particularly from the novel manner of supporting the numerous thermoelectric elements between the cylinders 16 and 17, renders the heat pump more easily and less expensively constructed than prior heat pump structures. The heat pump is, nevertheless, capable of withstanding the normal abuse to which a portable appliance, such as the bottle cooler and warmer of this invention, can be expected to be subjected.

Electrical current for operating and control purposes is preferably supplied to the heat pump 11 through a separable connector 33, which also functions to position the heat pump on the base 12. As best shown in Fig. 3, the connector 33 is similar to that used as base connectors for radio tubes and the like and includes a male element 34 mounted in the outer bottom wall 32 of the heat pump and a female element 36 recessed in the upper surface of the base 12. The connector 33 provides a convenient means for connecting a number of electrical circuits to the heat pump 11 and yet permits the heat pump to be easily removed from its base 12.

In accordance with this invention the bottle cooling and warming appliance herein disclosed includes an automatic control system which increases the usefulness of the appliance. This control is illustrated schematically in Fig. 5. Alternating electric current from an ordinary household supply system (at the left in Fig. 5), is supplied through an on-off switch 37 to a power supply or conversion system located in the base 12 of the appliance and including a transformer 38, a set of rectifiers 39 and a filter, comprising a choke 41 and a condenser 42. These elements cooperate, as is well understood, to convert household high voltage, alternating current to low voltage direct current such as is required for operation of the thermoelectric array 18. This direct current is supplied to the thermoelectric array through a reversing switch 43, which controls the direction of current flow through the array to cause the array to either extract heat from or add heat to the chamber 13 in the heat pump 11.

Switch 43 is preferably biased to occupy a position in which the thermoelectric array is caused to extract heat from the chamber 13 to cool items stored therein. This is the position thereof illustrated in Fig. 5. Switch 43 is actuated to another position, its heat position, when electric current is supplied to a relay actuator 44, which is mechanically connected to the contact arms of switch 43. Electric current from the alternating current supply system is supplied to the relay 44 through a pair of conductors 46 and 47, the latter of which includes a switch 48 which is adapted for both manual and automatic operation. Switch 48 has a fixed contact 49 and a movable contact arm 50 which is pivotally mounted on a shaft 51 for movement with respect to the shaft. The movable contact arm 50 is preferably biased to switch open position (Fig. 5) by any suitable means, such as a weight 52 carried by an extension of arm 50. Automatic actuation of switch 48 is effected by timing means, or a clock, indicated generally by the reference numeral 53 in Figs. 1 and 5, and including a clock motor 54 connected across leads 46 and 47 and adapted to rotate a switch actuating cam 56.

The switch actuating cam 56 rotates counterclockwise as viewed in Fig. 5 and is engageable once each revolution with one end of the movable contact arm 50 of switch 48. When engaged by cam 56 switch arm 50 moves into engagement with contact 49 to close switch 48 and energize relay 44, which, in turn, moves the contact arms of reversing switch 43 from cool position to heat position. The construction and arrangement of cam 56 with respect to switch arm 50 is such that arm 50 is maintained in engagement with contact 49 for a predetermined period of time, say one hour, each time the cam 56 is moved therepast.

The user of the appliance selects the time at which switch 48 is closed to initiate heating operation of the thermoelectric unit 11 by adjusting the position of cam 56 with respect to the clock motor 54 and other elements of the timing means 53. For this purpose, means, such as a slip clutch 57, is provided to permit cam 56 to be adjusted by turning a knob 58 which is connected to the cam.

The control system for the bottle cooling and warming device of this invention is also equipped with means whereby the user may manually set the appliance to either cool or heat items in the heat pump chamber 13 without the automatic timing control being in operation. One form of control means is illustrated in Fig. 5 and comprises a yoke 61 secured to shaft 51 and having spaced legs straddling the movable contact arm 50 of switch 48. The yoke 61 is moved by means of a knob 62 secured to the opposite end of the shaft 51. When the yoke 61 is rotated clockwise to a heat position, its upper leg engages contact arm 50 and moves it into engagement with contact 49, completing a circuit through switch 48 to relay 44. Energization of relay 44, of course, sets reversing switch 43 in its heat position. Switch 48 may also be held open to cause the heat pump 11 to cool continuously by rotating knob 62 counterclockwise to place yoke 61 in a cool position in which its lower leg engages movable contact arm 50 of switch 48 and holds the arm out of engagement with contact 49.

Contact arm 50 is made of a resilient material so as to permit the extension thereof to flex when engaged by cam 56 during a period when the arm is being held in open position by the yoke 61. The yoke 61, or some other member rotatable therewith, is preferably equipped with an indicating pointer 53 which cooperates with suitable indicia to indicate to the user of the appliance whether the switch 48 is positioned for automatic operation, for heating or for cooling.

The control circuit for the bottle cooler and warmer also preferably includes a signaling device for indicating to the user that the bottle being warmed has reached feeding temperature. This signaling device comprises a buzzer 64 connected in series with a thermostat 66 which is adapted to energize the buzzer upon sensing a predetermined temperature of, say, 98 degrees F. The thermostat 66 is preferably disposed in good transfer relationship with the inner cylinder 16 of the heat pump 11 and may be secured to the bottle wall 31 thereof, as indicated in Fig. 3. The thermostat 66 and buzzer 64 are preferably connected in parallel with the reversing switch relay 44 so that the buzzer circuit is conditioned for operation whenever the relay 44 is energized. The signal circuit may also be equipped with an on-off switch 67 by means of which the circuit may be rendered ineffective if no signal is desired.

The electrical circuit which supplies direct current to the thermoelectric array 18 for heating operation preferably includes another thermostat 68, which also is attached to the bottom wall 31 of the heat pump inner cylinder 16. This thermostat functions as an over-temperature safety switch to deenergize the thermoelectric array 18 in the event an undesirably high temperature is reached in the heat pump chamber 13.

*Operation*

The reversing switch 43 is biased to its cool position to supply direct current to the thermoelectric array 18 in a direction to cause conducting plates 24 to be cooled and conducting plates 25 to be heated. As is well understood, current flowing through a junction between dissimilar thermoelectric elements from an N material to a P material causes heat to be absorbed at the junction between the elements. Conversely, current flowing from a P material to an N material causes heat to be dissipated at the junction.

Cooling operation is obtained either by setting knob 62 to cause yoke 61 to maintain switch 48 open or, by virtue of yoke 61 being positioned in its "auto," or middle position, with the legs thereof out of contact with switch arm 50, and the cam 56 being out of engagement with the switch arm.

With the appliance set for automatic operation, i.e., yoke 61 in its middle position, the thermoelectric array 18 will receive current in a direction to cause it to cool the inner cylinder 16 of the heat pump and dissipate heat from the fins 19 on the outer cylinder 17. Cooling operation continues until at a particular time, determined by the user, cam 56 is driven into engagement with switch 50 to close switch 48 and energize relay 44. This operation changes the position of the contact arms of the reversing switch 43 and reverses the direction of current flow through the thermoelectric array 18. Heat is then absorbed through the fins 19 on the heat pump and is pumped into the inner cylinder 16. Upon the inner cylinder reaching the predetermined temperature for which thermostat 66 is set to close its contacts, a circuit is established through the buzzer 64, which signifies to the user that the bottle in the heat pump 11 has been warmed to feeding temperature.

If the bottle in the heat pump 11 is not used and the appliance is permitted to continue on automatic operation, cam 56 will eventually move out of engagement with switch arm 50 and the weight 52 on this arm will cause it to move out of engagement with contact 49 and deenergize relay 44. This permits the contact arms of switch 43 to return to their cool position and causes the thermoelectric array 18 to return to cooling operation in which it extracts heat from the inner cylinder 16 of the heat pump. There is thus provided an automatic return to cooling operation, which insures that the contents of the infant feeding bottle will be chilled and preserved if not used at the time initially selected by the user but disregarded by his infant.

*Automobile unit*

Figure 6:
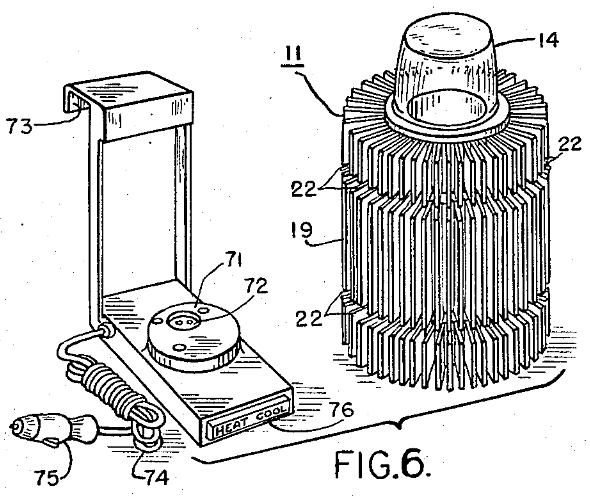
Fig. 6 is a perspective view of the components of a bottle cooling and warming appliance adapted for use in an automobile.

As mentioned previously, the heat pump 11 of the appliance illustrated in Fig. 1 is readily separable from its base 12. This separability of parts enables the heat pump 11 to be utilized with a simplified support bracket 71 which adapts the appliance for use in an automobile or other personal means of conveyance which is equipped with a direct current electrical supply. This form of the apparatus is illustrated in Fig. 6, in which the heat pump 11 is shown separated from the base 71. This base includes a connector socket 72 for receiving the connector 34 mounted in the bottom wall of the heat pump 11. The base 71 is also preferably equipped with a hook-like, upper extension 73 which is adapted to hook over the window trim molding in the automobile or other conveyance. Inasmuch as the automobile provides a supply of direct electrical current generally of the voltage required for operation of the thermoelectric array 18, by comparing Fig. 7 with Fig. 5, it will be seen that the electrical components of the base 71 (Fig. 6) are considerably simplified over those employed in the base 12 of Fig. 1. Further simplification in the automobile unit of Fig. 6 is effected by omission of the automatic time control arrangement. Current is supplied to the base 71 through an electrical cord 74 having a connector 75 on the end thereof, which connector is adapted to be plugged into the cigarette lighter outlet of the automobile. Electrical current is supplied to the heat pump 11 through a reversing switch 76, which is mounted in the base 71 and accessible to the user to permit selection of heating or cooling operation.

It can be seen that the compact heat pump resulting from utilization of this invention makes possible the construction of an appliance of unusual versatility. It is to be understood, however, that the principles of thermoelectric heat pump construction herein disclosed are applicable to other devices and appliances. Thus, while the invention is shown and described with reference to two embodiments thereof, it is to be understood that it is not so limited, but is susceptible of various changes and modifications without departing from the spirit thereof.

What is claimed is:

1. In a thermoelectric heat pump, a heat absorbing structure, a heat dissipating structure disposed in spaced relation to said heat absorbing structure, a plurality of elements of dissimilar thermoelectric materials disposed between said structures, dissimilar ones of said elements being alternately arranged, a plurality of spaced conducting members arranged in thermal transfer relationship with said heat absorbing structure and connecting adjacent ends of pairs of dissimilar elements, other spaced conducting members arranged in thermal transfer relationship with said heat dissipating structure and connecting adjacent ends of other pairs of dissimilar elements, said elements and said conducting members forming a series circuit, and a plurality of spacer strips on one of said structures and facing said other structure, said strips being disposed between the conducting members adjacent said one structure and positioning said elements with respect to said one structure.

2. Thermoelectric apparatus comprising two concentrically arranged cylinders, a plurality of elements of dissimilar thermoelectric materials disposed between said cylinders for pumping heat from one cylinder to the other cylinder, dissimilar ones of said elements being alternately arranged, spaced conducting members arranged in heat transfer relationship with the inner cylinder and connecting the inner ends of adjacent dissimilar elements, other spaced conducting members arranged in heat transfer relationship with the outer cylinder and connecting the outer ends of adjacent dissimilar elements, said elements and conducting members providing a series circuit through said elements, and spacer rings on one of said cylinders and facing the other of said cylinders, said rings projecting between adjacent conducting members for positioning said elements longitudinally of said one cylinder.

3. Thermoelectric apparatus comprising an inner cylindrical container, a cylindrical shell concentrically surrounding said container, a plurality of elements of dissimilar thermoelectric materials substantially radially arranged between said container and said shell in spaced rows extending longitudinally of said cylinder, dissimilar ones of said elements being alternately arranged in each of said rows, spaced conducting members connecting inner ends of adjacent dissimilar elements in each row, other conducting members connecting outer ends of adjacent dissimilar elements in each row, said members and said elements forming a series circuit through the elements of each row, and spacer rings on the outer surface of said container between the conducting members connecting the inner ends of said elements for positioning said elements longitudinally of said container.

4. Thermoelectric apparatus comprising two concentrically arranged cylinders, a plurality of elements of dissimilar thermoelectric materials disposed between said cylinders for pumping heat from one cylinder to the other cylinder, said elements being arranged in spaced rows extending longitudinally of said cylinders, dissimilar ones of said elements being alternately arranged in each of said rows, spaced conducting members arranged in heat transfer relationship with the inner cylinder and connecting the inner ends of adjacent dissimilar elements, other spaced conducting members arranged in heat transfer relationship with the outer cylinder and connecting the outer ends of adjacent dissimilar elements, said elements and conducting members providing a series circuit through said elements, and spacer rings on one of said cylinders and facing the other of said cylinders, said rings projecting between adjacent conducting members for positioning said elements longitudinally of said one cylinder.

5. Thermoelectric apparatus comprising an inner cylindrical container, a circumferentially segmented, cylindrical shell concentrically surrounding said container, a plurality of elongated elements of dissimilar thermoelectric materials substantially radially arranged between said container and said shell, dissimilar ones of said elements being alternately arranged, spaced conducting members connecting inner ends of adjacent dissimilar elements, other conducting members connecting outer ends of adjacent dissimilar elements, said members and said elements forming a series circuit through the elements, and clamping means encompassing said sleeve and forcing the segments of said sleeve inwardly for holding said elements in place between said sleeve and said container, whereby said elements are subjected to compressive forces directed substantially longitudinally of each of said elements.

6. Thermoelectric apparatus comprising two concentrically arranged cylinders, the outer cylinder being circumferentially segmented, a plurality of elements of dissimilar thermoelectric materials disposed between said cylinders for pumping heat from one cylinder to the other cylinder, dissimilar ones of said elements being alternately arranged, spaced conducting members arranged in heat transfer relationship with the inner cylinder and connecting the inner ends of adjacent dissimilar elements, other spaced conducting members arranged in heat transfer relationship with the outer cylinder and connecting the outer ends of adjacent dissimilar elements, said elements and conducting members providing a series circuit through said elements, spacer rings on one of said cylinders and facing the other of said cylinders, said rings projecting between adjacent conducting members for positioning said elements longitudinally of said one cylinder, and clamping means encompassing said outer cylinder and forcing the segments of said cylinder inwardly for maintaining good thermal contact between said cylinder and said conducting members.

7. Thermoelectric apparatus comprising an inner cylindrical container, a circumferentially segmented, cylindrical shell concentrically surrounding said container, a plurality of elements of dissimilar thermoelectric materials substantially radially arranged between said container and said shell, dissimilar ones of said elements being alternately arranged, spaced conducting members connecting inner ends of adjacent dissimilar elements, other conducting members connecting outer ends of adjacent dissimilar elements, said members and said elements forming a series circuit through the elements, spacer rings on the outer surface of said container between the conducting members connecting the inner ends of said elements for positioning said elements longitudinally of said container, and clamping means encompassing said sleeve and forcing the segments of said sleeve inwardly for maintaining good thermal contact between said cylinder and said conducting members and said sleeve and said other conducting members.

8. In a cooling and warming appliance for storing and heating infant feeding bottles and the like, a container, a reversible thermoelectric heat pump for alternatively extracting heat from or adding heat to said container depending upon the direction of electric current flow through said pump, a direct current supply, a reversing switch connected between said supply and said heat pump and having cool and heat positions, said switch being biased to its cool position, a clock, and settable means actuated by said clock for moving said switch from its cool position to its heat position at a predetermined time determined by the user of the appliance, said last-named means effecting return of said switch to its cool position at the expiration of a fixed period of time following movement of said switch to its heat position.

9. A cooling and warming appliance for storing and heating infant feeding bottles and the like comprising in combination, an upright, top-opening container, a shell surrounding said container and having vertical fins thereon providing extended heat transfer surface in contact with air surrounding the shell, a thermoelectric array disposed between said container and said shell for alternatively pumping heat from said container to said shell or from said shell to said container depending on the direction of current flow through the array, said array comprising a plurality of elements formed of dissimilar thermoelectric materials and a plurality of conducting members serially connecting said elements, certain of said members being in heat transfer relationship with said container and other of said members being in heat transfer relationship with said shell, said container, said array and said shell being secured together for handling as a unit, a base for supporting said unit, a power supply including current reversing means mounted on said base, and separable coupling means carried respectively by said unit and said base for conducting electric current from said power supply to said thermoelectric array.

References Cited in the file of this patent

UNITED STATES PATENTS

| | | |
|---|---|---|
| 413,136 | Dewey | Oct. 15, 1889 |
| 2,734,344 | Lindenblad | Feb. 14, 1956 |
| 2,837,499 | Lindenblad | June 10, 1958 |